(12) United States Patent
Herr

(10) Patent No.: US 6,836,141 B2
(45) Date of Patent: Dec. 28, 2004

(54) SUPERCONDUCTOR BALLISTIC RAM

(75) Inventor: Quentin P. Herr, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/410,923

(22) Filed: Apr. 11, 2003

(65) Prior Publication Data

US 2004/0201400 A1 Oct. 14, 2004

(51) Int. Cl.[7] .................................. H03K 19/195
(52) U.S. Cl. .................... 326/3; 326/1; 326/2; 365/162
(58) Field of Search .......................... 326/1–7; 365/160, 365/162; 11/162

(56) References Cited

U.S. PATENT DOCUMENTS

| 4,130,893 | A | 12/1978 | Henkels |
| 4,601,015 | A | 7/1986 | Ishida |
| 5,253,199 | A | * 10/1993 | Gibson .................. 365/162 |
| 5,260,264 | A | 11/1993 | Kurosawa et al. |
| 5,872,731 | A | * 2/1999 | Chan et al. .............. 365/162 |
| 6,078,517 | A | 6/2000 | Herr |
| 6,154,044 | A | 11/2000 | Herr |
| 6,229,332 | B1 | 5/2001 | Herr |

* cited by examiner

*Primary Examiner*—Anh Q. Tran
(74) *Attorney, Agent, or Firm*—Posz & Bethards, PLC

(57) ABSTRACT

A superconductor memory array (10) has a high associated throughput with low power dissipation and a simple architecture. The superconductor memory array (10) includes memory cells (12a–12d) arranged in a row-column format and each including a storage loop (14a–14d) with a Josephson junction (16a–16d) for storing a binary value. Row address lines (24a, 24b) each are magnetically coupled in series to a row of the memory cells (12a–12d), and column address lines (26a, 26b) each are connected in series to a column of the memory cells (12a–12d). A sense amplifier (38a, 38b) is located on each of the column address lines (26a, 26b) for sensing state changes in the memory cells (12a–12d) located in the columns during a READ operation initiated by row address line READ signals.

18 Claims, 3 Drawing Sheets

SUPERCONDUCTOR BALLISTIC RAM

RELATED APPLICATIONS

This application is related to co-pending application Ser. No. 10/411,106, filed concurrently herewith and entitled "Superconductor Output Amplifier," the contents of which are incorporated herein by reference.

1. Field of the Invention

This invention relates generally to superconductor systems and, more particularly, to a superconductor memory array with a simplified architecture and associated high bandwidth transmission line signal propagation.

2. Background of the Invention

Digital superconductor logic circuitry operating at cryogenic temperatures and at high speeds on the order of, for example, 20 GHz, requires compatible superconductor random access memory (RAM) arrays. Such RAM arrays include memory cells, each of which includes a storage loop with a switchable Josephson junction storage element, and each of which is capable of storing binary information based on the presence and direction (clockwise or counterclockwise) of a persistent loop current therein. Ideally, such RAM arrays are dense, have low power requirements and have an associated low latency and high throughput.

While superconductor RAM arrays are known, none meet all of the above criteria. Therefore, superconductor RAM arrays are typically considered as a limiting factor in digital superconductor technology. Specifically, nearly all of conventional superconductor RAM array designs require some type of a sense amplifier in each memory cell to detect changes in the memory cell binary state, such as those changes that occur during READ operations, and to accordingly inform the logic circuitry. These sense amplifiers increase the overall array footprint and increase the array power requirements as well as the latency of signals propagating through the array.

In addition, because each column of memory cells is typically treated as a large parasitic inductance, a voltage READ level must be set and then stabilized over a period of time to compensate for an inductance/resistance (L/R) relaxation time constant representative of signal propagation latency and corresponding power dissipation due to array transmission line impedance mismatch.

In view of the above limitations, it is therefore an object of the present invention to provide a superconductor memory array formed from a high bandwidth transmission line of engineered impedance.

It is also an object of the present invention to provide a superconductor RAM array that is dense, has low associated power dissipation and has an associated low latency and high throughput.

It is another object of the present invention to provide a superconductor RAM array that has a simplified architecture in which a sense amplifier is not required for each array cell.

In view of the above, the present invention provides a superconductor memory array with a high associated throughput, low power dissipation and a simple architecture. The superconductor memory array includes memory cells arranged in a row-column format and each including a storage loop with a Josephson junction for storing a binary value. Row address lines each are magnetically coupled in series to a row of the memory cells, and column address lines each are connected in series to a column of the memory cells. A sense amplifier is located on each of the column address lines for sensing state changes in the memory cells located in the columns during a READ operation initiated by row address line READ signals.

According to another embodiment, the present invention provides a superconductor memory cell configuration including memory cells arranged in a column, each of the memory cells including a storage loop with a Josephson junction for storing a binary value. A column address line connects the memory cells in series, and a sense amplifier located on the column address line senses state changes in the memory cells during a READ operation.

According to another embodiment, the present invention provides a superconductor memory configuration with a memory cell including a storage loop with a Josephson junction for storing a binary value, a row address line input magnetically coupled to the storage loop for receiving a READ voltage signal to initiate a READ operation, a column address line input connected to the Josephson junction for receiving a series of SFQ pulses, for outputting all of the series of SFQ pulses if an internal persistent loop current does not change direction during the READ operation, and for outputting fewer than all of the series of SFQ pulses if the internal persistent loop current changes direction during the READ operation, and a bridge resistor arranged in parallel with the Josephson junction for damping the Josephson junction. The superconductor memory configuration also includes a non-dedicated sense amplifier for receiving all of the series of SFQ pulses if the internal persistent loop current does not change direction during the READ operation, for receiving fewer than all of the series of SFQ pulses if the internal persistent loop current changes direction during the READ operation, and for outputting a signal indicative of the binary value stored in the storage loop based on how many of the series of SFQ pulses it receives.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE INVENTION

Figure 1:
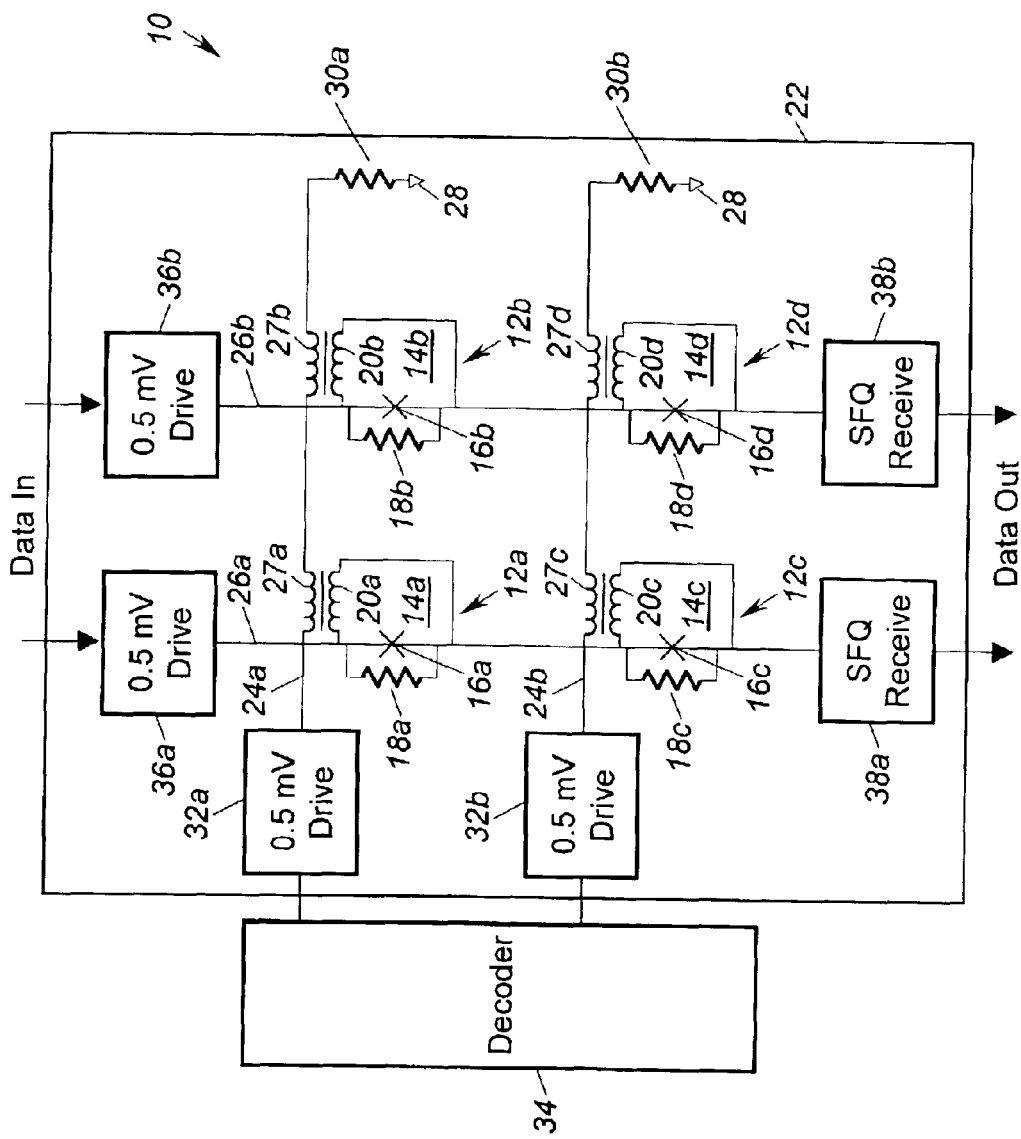
FIG. 1 is a schematic block diagram of a superconductor memory array according to a preferred embodiment of the present invention.

Referring now to the drawings in which like numerals reference like parts, FIG. 1 shows a superconductor memory array (memory array) 10. The memory array 10 includes memory cells such as the exemplary memory cells 12a–12d that are formed in columns that constitute microstrip transmission lines and include respective single junction Josephson storage loops 14a–14d, or superconducting quantum interference devices (SQUIDs), rather than multi-junction SQUIDs that are typically used in superconductor memory cells. The Josephson storage loops 14a–14d include well-known Josephson circuitry components such as Josephson junctions 16a–16d each having a critical current on the order of about 100 μA, bridge resistors 18a–18d arranged in parallel with the respective Josephson junctions 16a–16d for damping purposes, and wiring elements, represented by inductors 20a–20d. Each of the bridge resistors 18a–18d may be either an explicit structure or integral to the junction device. The wiring elements 20a–20d represent wire connections between the memory cells 12a–12d and a wiring layer 22, which is a metal layer formed on a substrate such as silicon from a superconducting metal such as niobium or niobium nitride, and that has an associated inductance on the order of a few pH as well as an associated capacitance. The memory cells 12a–12d are capable of storing binary information through respective internal persistent loop currents that are ±25 μA, with the current direction, or state (clockwise or counterclockwise), depending upon whether a "1" or a "0" is being stored. As is well known to those skilled in the art, an additional DC flux bias, not shown, may be used to produce a uniform offset to the current in the loop. This allows the "1" and "0" states to be of equal amplitude and opposite polarity.

The memory cells 12a–12d are arranged in a row-column format and are accessed during READ/WRITE operations by row address lines 24a, 24b and column address lines 26a, 26b every clock cycle which, as will be discussed below, may be set anywhere from 10–100 GHz depending upon specific array and operating environment parameters. Specifically, the row address line 24a, which is preferably a microstrip transmission line (microstrip line) that is engineered to have an impedance that produces a line current as discussed below, includes inductors 27a, 27b that magnetically couple the row address line 24a to the memory array cells 12a, 12b through the inductors 20a, 20b. Likewise, the row address line 24b, which also is preferably a microstrip line, includes inductors 27c, 27d that magnetically couple the row address line 24b to the memory array cells 12c, 12d through the inductors 20c, 20d. The row address lines 24a, 24b are both connected to the metal layer 22 at a common node 28 and include impedance matching elements 30a, 30b for eliminating the UR relaxation time associated with microstrip signal transmissions on unmatched microstrip transmission lines.

The row address line 24a includes a row driver 32a that is enabled every clock cycle and that generates a READ or WRITE voltage for enabling a READ or WRITE operation for the memory cells 12a, 12b located on the row address line 24a. Together, the row address line 24a and the row driver 32a are configured in a wave pipeline format. The READ or WRITE voltage is preferably a square wave voltage having an amplitude on the order of about ±0.5 mV that results in a line current on the order of about 50 μA, assuming that the critical currents of the Josephson junctions 16a, 16b is on the order of about 100 μA. The 50 μA line current refers to the current induced in the memory cell. The current in the address line may be more or less than this value depending on the efficiency of the magnetic coupling. However, the amplitude of the square wave voltage, and therefore the line current, are scalable depending upon the value of the critical currents of the Josephson junctions 16a, 16b. The square wave voltage may be, for example, negative for a WRITE operation or positive for a READ operation, and has a width that is sufficient enough to enable the square wave to overlap with voltage signals input over the column address lines 26a, 26b (see below). However, the square wave voltage could alternatively be positive for a WRITE operation or negative for a READ operation, dependent upon logic circuitry design. Similarly, the row address line 24b includes a row driver 32b that, when enabled, generates a READ or WRITE voltage for enabling a READ or WRITE operation for one of the memory cells 12c, 12d located on the row address line 24b. The row address line 24b and the row driver 32b are configured in a wave pipeline format. The square wave voltage has the same characteristics as the READ or WRITE voltage described above in connection with the row driver 32a and is likewise scalable depending upon the critical currents of the Josephson junctions 16c, 16d.

The row drivers 32a, 32b are bi-polar and preferably configured in a push-pull design to enable either of the above positive or negative square wave voltages to be generated for READ/WRITE operations. The row drivers 32a, 32b may be of the type disclosed in co-pending U.S. patent application Ser. No. 10/411,106, filed concurrently herewith and entitled "Superconductor Output Amplifier," the contents of which are incorporated herein by reference. The bipolar signal levels desired for the present invention may be obtained using a series stack of two such output amplifier units that are powered with bias current of opposite polarity. The row drivers 32a, 32b are selectively enabled upon receiving appropriate row select instructions from a decoder 34, which is preferably a well known binary type decoder that is scaled according to the size of the memory array 10 and that itself receives memory access instructions from a superconductor processor or other similar superconductor memory access circuitry (not shown).

Column address line 26a, which is preferably a microstrip line, directly connects the memory cells 12a, 12c, and more specifically the Josephson junctions 16a, 16c of the memory cells 12a, 12c, in series. Similarly, column address line 26b, which is also preferably a microstrip line, directly connects the memory cells 12a, 12b and, more specifically, the Josephson junctions 16b, 16d of the memory cells 12b, 12d, in series. The column address line 26a is preferably integrally formed with the memory cells 12a, 12c from the same microstrip transmission line, while the column address line 26b is preferably integrally formed with the memory cells 12b, 12d from the same microstrip transmission line.

The column address lines 26a, 26b include column drivers 36a, 36b for inputting a series of pulsed voltage signals each clock cycle. More specifically, the column drivers 36a, 36b are for inputting 2–4 single flux quantum (SFQ) pulses, each having an amplitude of about 1 mV that results in a line current on the order of about 50 μA, to approximate a square wave signal that is about 10 ps long, which is much narrower than the square wave signal output by the row drivers 32a, 32b. However, as with the row drivers 32a, 32b, the SFQ pulses generated by the column drivers 36a, 36b are scalable depending upon the critical currents of the Josephson junctions 16a–16d. In addition, the column address lines 26a, 26b also include sense amplifiers 38a, 38b, which are non-dedicated in that they are used in conjunction with all memory cells in each column, and which are for sensing directional changes in persistent loop currents stored in the memory cells 12a–12d located on the respective column address lines 26a, 26b during READ operations.

In particular, the sense amplifiers 38a, 38b are capable of sensing whether one of the series of SFQ pulses input onto one of the column address lines 26a, 26b during a clock cycle has been absorbed by one of the memory cells 12a–12d, thereby indicating a memory cell state change, and of thereafter outputting a signal indicative of the binary information stored in each accessed memory cell. Each of the sense amplifiers 38a, 38b is preferably a Josephson Transmission Line (JTL), which is well known in the art to be suitable for receiving SFQ pulses from a transmission line. In the simplest case, the sense amplifiers 38a, 38b will trigger and regenerate an SFQ pulse for each pulse they respectively receive. For example, when a series of three SFQ pulses is output from the column driver 36a, the sense amplifier 38a generates three pulses, but when a series of two SFQ pulses is output on the column address line 26a from the memory cells 12a, 12c, the sense amplifier 38a generates two pulses. However, the exact number of SFQ pulses generated by the sense amplifiers 38a, 38b is unimportant, so long as the sense amplifier threshold is set such that a memory cell state change is detectable. For example, the threshold of the sense amplifiers 38a, 38b could be set such that an input of three SFQ pulses produces single SFQ pulses respectively output from the sense amplifiers 38a, 38b, but an input of two SFQ pulses produces no output pulses.

It should be appreciated by those skilled in the art that the memory array 10 may include more, or fewer memory cells, and therefore more, or fewer corresponding row address lines, row drivers, column address lines, column drivers and sense amplifiers depending upon particular superconducting logic application memory requirements.

Still referring to FIG. 1, operation of the memory array 10 will now be described with particular reference to READ and WRITE operations. Regarding the READ operation, the row drivers 32a, 32b receive READ instructions from the decoder 34 and send appropriate READ voltage signals on the row address lines 24a, 24b to respective memory cells 12a–12d during a clock cycle. The READ voltage signal is effectively a WRITE 0 operation, as the memory cells 12a–12d in the memory array 10 are designed to be destructive read out type cells. However, it is contemplated that the memory array may alternatively be designed with memory cells of the non-destructive read out type.

Each of the column drivers 36a, 36b also inputs the above described respective series of SFQ pulses on the column address lines 26a, 26b. Consequently, when the READ voltage signals and the SFQ pulses overlap at each of the memory cells 12a–12d, each of the memory cells 12a–12d either absorbs one of the SFQ pulses if the internal state is a "1" or does not absorb one of the SFQ pulses if the internal state is a "0."

More specifically, if for example the internal persistent loop current in the memory cell 12a is +25 µA if a binary value of "1" is stored therein, a positive READ square wave voltage signal representative of a WRITE 0 command produces a 50 µA current. This current, in combination with the 50 µA peak amplitude current of the SFQ pulses produced in conjunction with the READ command and the +25 µA internal persistent loop current in the memory cell 12a, results in a total current of +125 µA at the Josephson junction 16a. As this current exceeds the critical current threshold of the Josephson junction 16a, one of the SFQ pulses is absorbed, and the internal state of the memory cell 12a is manipulated. The internal persistent loop current in the memory cell 12a therefore changes from +25 µA to −25 µA, or in other words changes from a current circulating in the Josephson storage loop 14a in a clockwise direction to one circulating in the counterclockwise direction, and the binary information in the memory cell 12a is changed from "1" to "0" and is therefore effectively erased. This is because the memory array 10 is designed as a destructive read-out memory array and the READ operation is effectively a WRITE 0 operation.

If on the other hand the internal persistent loop current in the memory cell 12a is −25 µA if a binary value of "0" is stored therein, a positive READ square wave voltage signal produces a 50 µA current. This current, in combination with the 50 µA peak amplitude current of the SFQ pulses and the −25 µA internal persistent loop current in the memory cell 12a, results in a total current of 75 µA at the Josephson junction 16a. As this current does not exceed the critical current threshold of the Josephson junction 16a, none of the SFQ pulses is absorbed, and the internal state of the memory cell 12a is not manipulated. Therefore, the internal persistent loop current in the memory cell 12a remains at −25 µA, and the binary information in the memory cell 12a effectively remains as "0."

If one of the SFQ pulses is absorbed and the binary information in the memory cell 12a is changed from "1" to "0" as a result of the above READ operation, the SFQ pulse voltage output on the column address line 26a is effectively reduced by approximately ⅓ assuming that the column driver 36a inputs a series of three SFQ pulses. Consequently, the sense amplifier 38a, which is designed with inverted logic, does not trigger and therefore outputs a signal indicating that "1" was read out from the memory cell 12a. If none of the SFQ pulses is absorbed and the binary information in the memory cell 12a remains a "0" during the above READ operation, the SFQ voltage output on the column address line 26a is not reduced, the sense amplifier 38a triggers and therefore outputs a signal indicating that "0" was read out from the memory cell 12a.

Regarding the WRITE operation, the row drivers 32a, 32b receive either WRITE 0 or WRITE 1 instructions from the decoder 34 and send appropriate WRITE voltage signals on the row address lines 24a, 24b to the memory cells 12a–12d. The column drivers 36a, 36b also input the above-described series of SFQ pulses on the column address lines 26a, 26b to the memory cells 12a–12d. Consequently, when the respective WRITE voltage signals and the SFQ pulses meet at the memory cells 12a–12d, the respective internal states of the memory cells 12a–12d are manipulated accordingly.

Specifically, a WRITE 0 operation is performed as described above with reference to the READ operation. Regarding a WRITE 1 operation, if for example the internal persistent loop current in the memory cell 12a is −25 µA if a binary value of "0" is stored therein, a negative square wave voltage signal representative of a WRITE 1 command produces a −50 µA current. This current, along with the −50 µA peak amplitude current of the corresponding SFQ pulses and the −25 µA internal persistent loop current in the memory cell 12a, results in a total current of −125 µ at the Josephson junction 16a. As this current and exceeds the critical current threshold of the Josephson junction 16a, one of the SFQ pulses is absorbed, the internal persistent loop current in the memory cell 12a changes from a value of −25 µA to +25 µA and the binary information in the memory cell 12a is changed from "1" to "0."

If on the other hand the internal persistent loop current in the memory cell 12a is +25 µA and therefore indicative of a stored binary value of "1", a negative square wave voltage signal representative of a WRITE 1 command produces a −50 µA current. This current, in combination with the −50 µA peak amplitude current of the corresponding SFQ pulses and the +25 µA internal persistent loop current in the memory cell 12a, results in a total current of −75 µA at the Josephson junction 16a. As this current is less than the critical current threshold of the Josephson junction 16a, none of the SFQ pulses is absorbed, the internal persistent loop current in the memory cell 12a remains at +25 µA, and the binary information in the memory cell 12a effectively remains as "1".

The memory array 10 may be designed so that the sense amplifiers 38a, 38b are active even during WRITE operations. However, the output of the sense amplifiers 38a, 38b is preferably gated so that output data is generated only for explicit READ operations and not for WRITE operations.

Figure 3:
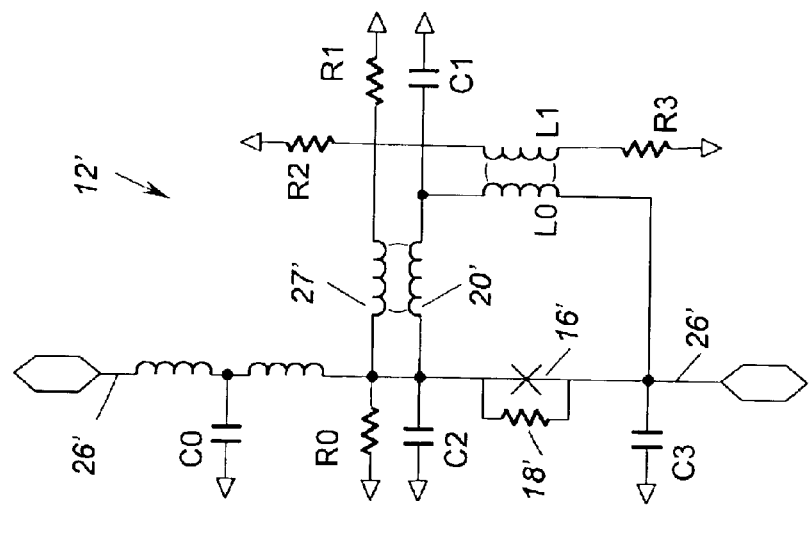
FIG. 3 is a circuit schematic diagram of a single exemplary unit cell of the type that forms the column of memory array cells in FIG. 2.
Figure 2:
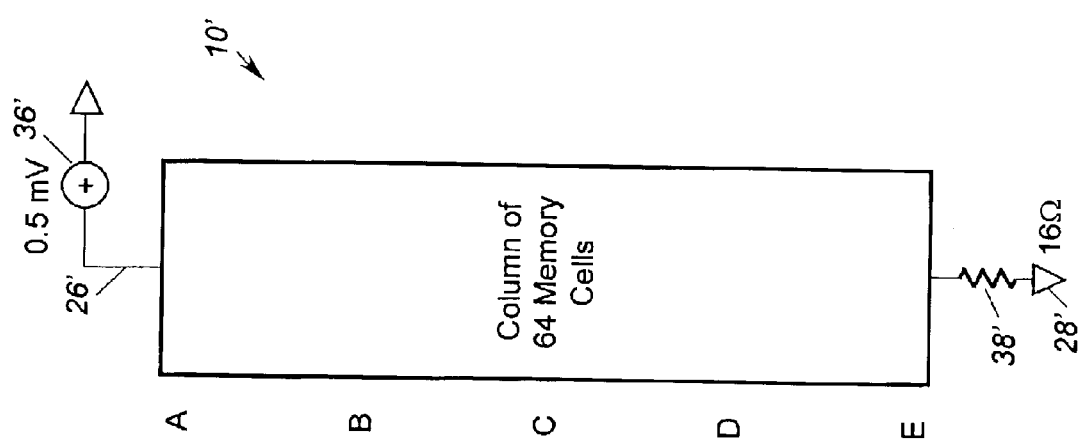
FIG. 2 is a circuit schematic diagram of a column of memory array cells of the type that form the superconductor memory array in FIG. 1.
Figure 4:
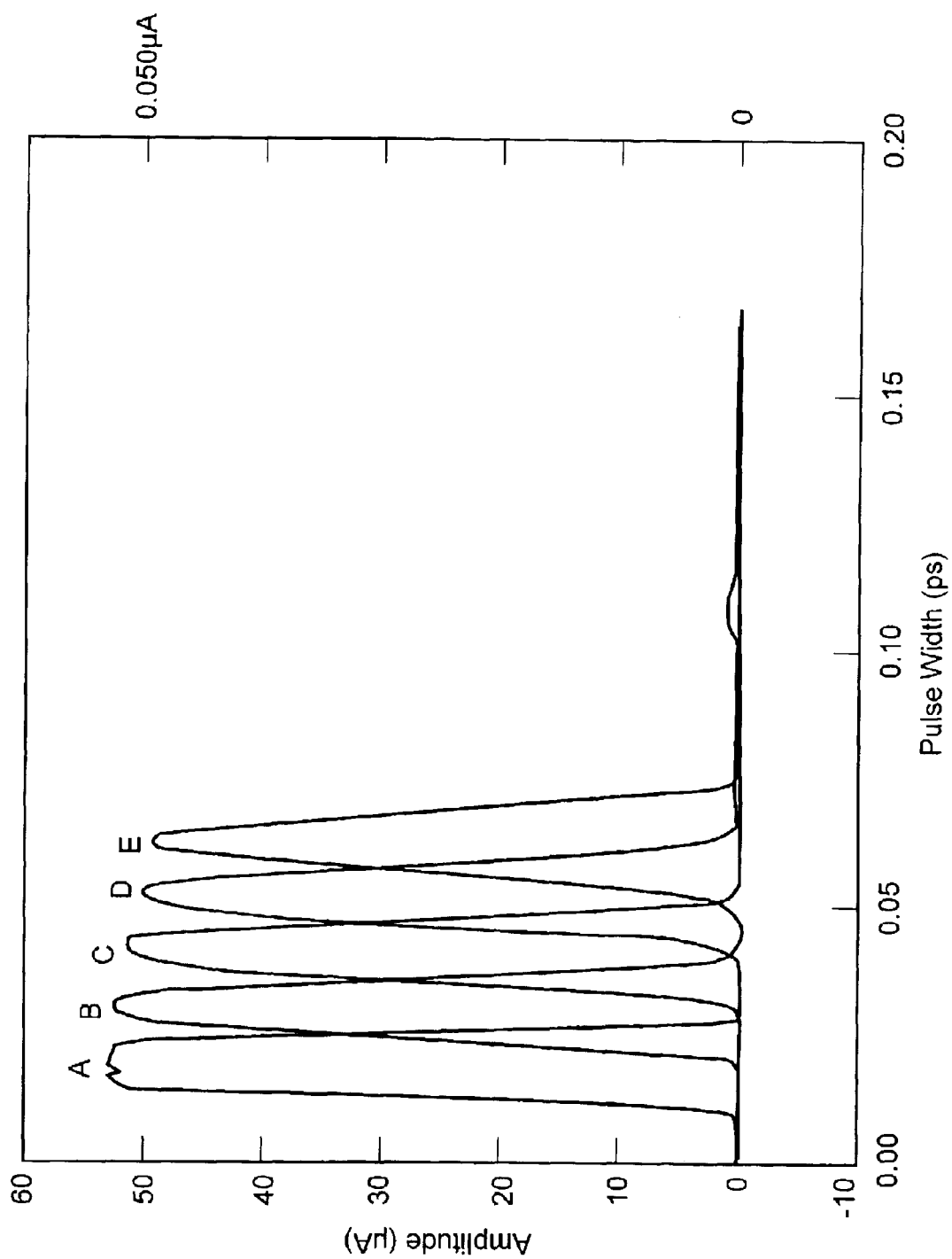
FIG. 4 is a graph of amplitude versus time of sample current simulations taken at points in the column of memory array cells in FIG. 2.

Referring now to FIGS. 2-4, results of a SPICE simulation indicative of transmission line dynamics of the memory array 10 will now be discussed. FIGS. 2 and 3 are circuit schematic diagrams of an exemplary column of memory cells 10' of the type that may be used in the superconductor memory array 10 and of a single exemplary memory cell 12' of the type that may be used in the column of memory cells 10', respectively. The column of memory cells 10' includes 64 memory cells; however, as discussed above, the number of cells in each column and in each row of a memory array will vary depending upon underlying superconductor logic memory requirements. A column driver 36' inputs a series of 0.5 mV SFQ pulses on a microstrip column address line 26' that includes a 10Ω resistor 38' for modeling the resistance of a sense amplifier (not shown). Both the column driver 36' and the resistor 38' are tied to a common node 28' in a manner described above in connection with the memory array 10 in FIG. 1.

As shown in FIG. 3, the memory cell 12', which is representative of all memory cells that form the column of memory cells 10', includes a Josephson junction 16', a bridge resistor 18' (10Ω), capacitors C0, C2, C3 (20 fF), capacitor C1 (7.7 fF), resistors R0, R1, R2, R3 (5Ω), inductors 20', 27'(20 pH) and inductors L0, L1 (20 pH). The resistors R0–R3 and the capacitor C1 are used to model the environment around the column, i.e. adjacent columns, drivers, and terminating resistors, while the inductors L0, L1 implement the DC flux bias discussed above in connection with the unit memory cells.

FIG. 4 is a graph of line current through five memory cells in the column of memory cells 10' as measured at tap points A, B, C, D and E in FIG. 2 and indicative of transmission line dynamics of the column of memory cells 10'. Line current resulting from a series of SFQ pulses appropriate for a single operation of about 12 ps in width is shown at the tap points A–E, with tap point A being a tap point at an output of the column driver 36', tap point E being a tap point at an input of the resistor 38', and tap points B, C and D being tap points equally spaced within the column of memory cells 10'. As shown, the line current shows little attenuation, and therefore little power dissipation and latency, as it travels through the column of memory cells 10', thereby indicating that the engineered impedance of the microstrip line from which the column address line 26' and the memory cells therein are formed enables signals to travel through the column of memory cells 10' at light speed with little power dissipation.

As will now be appreciated by one skilled in the art upon reading the foregoing description, a memory array according to the present invention is formed from a microstrip transmission line or high bandwidth transmission line of engineered impedance. The memory array is dense and has no L/R relaxation time constant. The absence of an L/R relaxation time constant due to impedance matching therefore enables the memory array to have low associated power dissipation, low associated latency and high throughput. Also, the memory array of the present invention has a simplified architecture in which a sense amplifier is not required for each array memory cell.

While the above description is of the preferred embodiment of the present invention, it should be appreciated that the invention may be modified, altered, or varied without deviating from the scope and fair meaning of the following claims.

What is claimed is:

1. A superconductor memory array, comprising:
    memory cells arranged in a row-column format, each of the memory cells including a storage loop with a Josephson junction for storing a binary value;
    row address lines each being magnetically coupled in series to a row of the memory cells;
    column address lines each being connected in series to a column of the memory cells; and
    sense amplifiers each being located on one of the column address lines for sensing state changes in the memory cells located in columns of the memory cells during a READ operation initiated by row address line READ signals.

2. The superconductor memory array of claim 1, wherein each of the memory cells is connected to a respective one of the column address lines at the Josephson junction and further comprises:
    a bridge resistor arranged in parallel with the Josephson junction for heavily damping the Josephson junction; and
    an inductor for magnetically coupling the memory cell to a respective one of the row address lines.

3. The superconductor memory array of claim 1, wherein each of the row address lines comprises a microstrip row address line connected to a common node and a resistor for matching a microstrip row address line impedance to eliminate an L/R relaxation time constant associated with each of the row address lines.

4. The superconductor memory array of claim 1, further comprising:
    row drivers for generating the row address line READ signals during a clock cycle to initiate the READ operation;
    column drivers for generating SFQ pulses on respective column address lines during the clock cycle;
    wherein the sense amplifiers are for sensing changes in direction of respective internal persistent loop currents in the memory cells located in the columns of the memory cells during the READ operation based on a status of the SFQ pulses when output from the memory cells.

5. The superconductor memory array of claim 4, wherein the sense amplifiers are for sensing the changes in direction of the respective internal persistent loop currents in the memory cells located in the columns of the memory cells during the READ operation when the row drivers output READ signals and the sense amplifiers detect fewer of the SFQ pulses output from the memory cells than were output by the column drivers.

6. The superconductor memory array of claim 4, wherein the row drivers are for outputting positive square wave voltage signals for the READ operation.

7. The superconductor memory array of claim 4, wherein the row address drivers are for outputting positive square wave signals of sufficient width during the READ operation to enable the positive square wave signals to overlap with the SFQ pulses output by the column drivers.

8. The superconductor memory array of claim 4, wherein column drivers are for generating the SFQ pulses during the READ operation on the respective column address lines during the clock cycle, the SFQ pulses having an associated current that, when combined with a current associated with the READ signals and the persistent loop current in one or more of the memory cells, is capable of exceeding a memory cell Josephson junction critical current.

9. The superconductor memory array of claim 1, wherein the row drivers and the row address lines are configured in a wave pipeline format.

10. The superconductor memory array of claim 1, wherein the memory cells comprise destructive readout memory cells.

11. A superconductor memory cell configuration, comprising:
   memory cells arranged in a column, each of the memory cells including a storage loop with a Josephson junction for storing a binary value;
   a column address line for connecting the memory cells in series; and
   a sense amplifier located on the column address line for sensing state changes in the memory cells during a READ operation.

12. The superconductor memory cell configuration of claim 11, wherein each of the memory cells is connected to the column address line at the Josephson junction and further comprises a bridge resistor arranged in parallel with the Josephson junction for damping the Josephson junction.

13. The superconductor memory cell configuration of claim 11, further comprising a column driver for generating SFQ pulses on the column address line during a clock cycle, wherein the sense amplifier is for sensing changes in direction of respective internal persistent loop currents in the memory cells located in the column during the READ operation based on the SFQ pulses output from the memory cells.

14. The superconductor memory cell configuration of claim 13, wherein the sense amplifier is for sensing the changes in direction of the respective internal persistent loop currents in the memory cells located in the columns during the READ operation when the sense amplifier detects fewer of the SFQ pulses output from the memory cells than were output by the column driver.

15. The superconductor memory cell configuration of claim 11, wherein the memory cells comprise destructive readout memory cells.

16. The superconductor memory cell configuration of claim 11, further comprising:
   additional memory cells arranged in additional respective columns, the additional memory cells including additional respective storage loops with additional respective Josephson junctions for storing additional respective binary values;
   additional column address lines for connecting memory cells in each of the additional respective columns in series; and
   additional sense amplifiers each located on one of the additional column address lines for sensing state changes in the memory cells in each of the additional respective columns during a READ operation.

17. The superconductor memory cell configuration of claim 16, further comprising row address lines each being magnetically coupled in series to a row of the memory cells arranged in a column and the additional memory cells arranged in additional respective columns, each of the row address lines comprising a microstrip row address line connected to a common node and a resistor for matching a row address line microstrip impedance to eliminate an L/R relaxation time constant associated therewith.

18. A superconductor memory configuration, comprising:
   a memory cell including:
      a storage loop including a Josephson junction for storing a binary value;
      a row address line input magnetically coupled to the storage loop for receiving a READ voltage signal to initiate a READ operation;
      a column address line input connected to the Josephson junction for receiving a series of SFQ pulses, for outputting all of the series of SFQ pulses if an internal persistent loop current does not change direction during the READ operation, and for outputting fewer than all of the series of SFQ pulses if the internal persistent loop current changes direction during the READ operation;
      a bridge resistor arranged in parallel with the Josephson junction for damping the Josephson junction; and
   a non-dedicated sense amplifier for receiving all of the series of SFQ pulses if the internal persistent loop current does not change direction during the READ operation, for receiving the fewer than all of the series of SFQ pulses if the internal persistent loop current changes direction during the READ operation, and for outputting a signal indicative of the binary value stored in the storage loop based on how many of the series of SFQ pulses are received.

* * * * *